United States Patent [19]

Akamatsu

[11] 4,010,387
[45] Mar. 1, 1977

[54] POWER TRANSISTOR SWITCHING APPARATUS
[75] Inventor: Masahiko Akamatsu, Amagasaki, Japan
[73] Assignee: Mitsubishi Denki Kabushiki Kaisha, Toyko, Japan
[22] Filed: Apr. 14, 1975
[21] Appl. No.: 567,995
[30] Foreign Application Priority Data
  May 11, 1974  Japan .............................. 49-52517
[52] U.S. Cl. .................................. 307/253; 361/1; 361/101
[51] Int. Cl.² .................. H03K 17/64; H03K 17/60
[58] Field of Search .......... 307/253, 251, 202, 315, 307/237; 317/148.5 R, 33 R, 33 C
[56] References Cited
UNITED STATES PATENTS

| | | |
|---|---|---|
| 3,105,160 | 9/1963 | Adler .............................. 307/253 X |
| 3,170,074 | 2/1965 | Hill ................................ 307/253 X |
| 3,436,608 | 4/1969 | Cavlier et al. ................. 307/253 X |
| 3,571,614 | 3/1971 | Rolstead ........................ 307/253 X |

Primary Examiner—John Zazworsky
Attorney, Agent, or Firm—Oblon, Fisher, Spivak, McClelland & Maier

[57] ABSTRACT

A power transistor switch is disclosed which includes a transistor having an emitter, a collector and a base for ON-OFF switching, the transistor being connected in series to a path connecting a power source and a load. Means are provided for controlling reapplied voltage which is reapplied between the emitter and the collector of the transistor during the transition period when the transistor is switched to the OFF state to suppress the reapplied voltage at the time the collector current is substantially broken.

3 Claims, 15 Drawing Figures

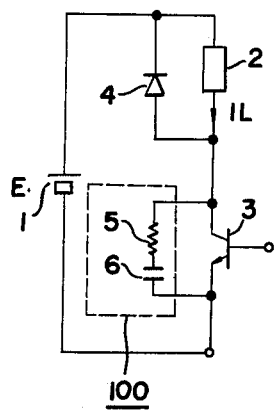
FIG. 1a
PRIOR ART
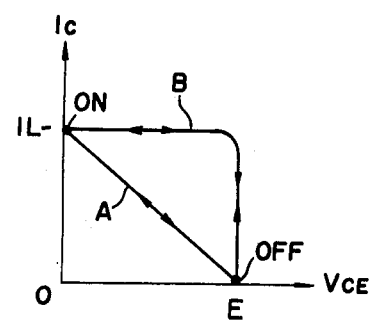
FIG. 1b
FIG. 1c
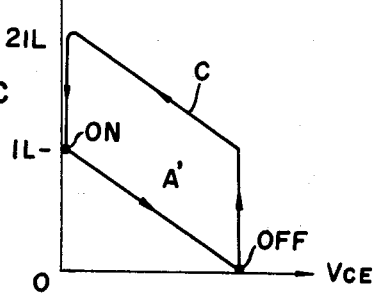
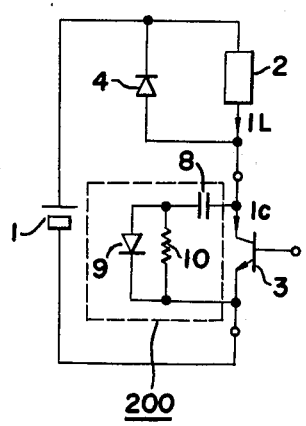
FIG. 2a
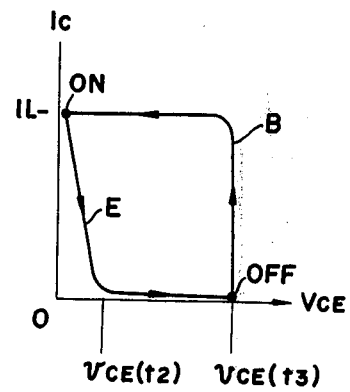
FIG. 2b

POWER TRANSISTOR SWITCHING APPARATUS

BACKGROUND OF THE INVENTION

1. Field of the Invention:

The present invention relates to a power transistor switch for preventing breakdown at the time of turning off a power transistor switch which is used at a relatively high voltage such as in a chopper or in an inverter, etc.

2. Description of the Prior Art:

Heretofore, the conventional type power transistor comprises a transistor 3 connected in series to the path connecting a power source 1 to a load 2 as shown in FIG. 1(a).

If the closed loop comprises only resistance, the Lissajous' diagram of the collector voltage $V_{CE}$ and the collector current $I_C$ for ON-OFF operation of the transistor 3 is shown as line A of FIG. 1(b). However, the closed loop comprises a wiring inductance and a load inductance. Accordingly, the resurge of the line A cannot be considered, especially in a power switch.

In usual applications for which a load inductance is not neglected, it has been customary to combine a diode 4 for commutating the load current during the OFF state of the transistor. In this case, the Lissajous' diagram is shown by curve B of FIG. 1(b). An overshoot of the reapplied voltage is generated after the rise of the reapplied voltage while turning off the transistor with the wiring inductance.

A surge absorber 100 consisting of a capacitor 6 and a series resistor 5 is connected in parallel to the transistor for controlling the overshoot voltage. However, the Lissajous' diagram for a switch having a conventional surge absorber for controlling the overshoot is substantially the same as the resurge B of FIG. 1(b).

In order to improve the Lissajous' diagram, it is usually necessary to change the constant of the surge absorber by more than one figure. It is especially necessary to drastically decrease the resistance of the resistor 5.

The resistance should be decreased as follows. The resistance $R_5$ of the surge absorber required for providing the $I_C - V_{CE}$ trace from the ON state to the OFF state as the line A', FIG. 1(c), of a pure resistive load is given by the equation:

$$R_s \approx (E/I_L)$$

wherein $E$ designates a power voltage and $I_L$ designates a load current.

On the other hand, when the switching is from the OFF state to the ON state, the current for discharge through the resistor 5 and the capacitor 6 is added. Accordingly, the $I_C - V_{CE}$ trace is given as the curve C of FIG. 1(c) wherein the collector current peak value $I_{CP}$ is $$I_L + (V_C/R_s) \approx 2I_L.$$

Incidentally, the transistor causes the sudden fall of current amplification and the rise of collector voltage by passing current over the rated collector current. Accordingly, the switch is not used in practice with the Lissajous' diagram condition of FIG. 1(c). Because of this reason, the surge absorber 100 having only the reapplied voltage overshoot control effect shown in the Lissajous' diagram condition of curve B of FIG. 1(b) has been used.

When a transistor is used as a power switch, the transistor is easily broken by a secondary breakdown such as a local thermal break phenomena, e.g., a local temperature rise, a local breakdown for a short period, a local current concentration, a local thermal loss, etc.. (hereinafter referred to as a secondary breakdown). In the conventional circuit, it has been necessary to derate (decreasing practical current and voltage to ½–¼) the maximum rated collector current, the maximum rated collector-emitter withstand voltage $V_{CEO}$ (open circuit between base and emitter) and the collector-base withstand voltage $V_{CBO}$ (short circuit between base and emitter and substantially the same with the collector-emitter withstand voltage $V_{CES}$ at certain inverse bias).

SUMMARY OF THE INVENTION

It is an object of the present invention to provide a power transistor switch which overcomes the disadvantages noted above to prevent breakdown during turn off and to utilize the maximum rated value of the transistor without high derating to improve the efficiency.

It is another object of the invention to provide a power transistor switch for handling increased power.

It is yet another object of the present invention to prevent secondary breakdown at turn off by providing the reapplied voltage suppress means for suppressing the reapplied voltage rising speed during the period the transistor is switched from the ON state to the OFF state; to reduce the reapplied voltage suppress means by combining a reverse bias; and to overcome dependency of the reapplied voltage suppress effect to the rise of the junction temperature.

It is still another object of the invention to provide a balanced transistor switch which separately receives a normal turn-on loss and switching power by combination with a Darlington connection.

The foregoing and other objects are attained in accordance with one aspect of the present invention through the provision of a power transistor switch comprising: a transistor having an emitter, a collector and a base for ON-OFF switching, the transistor being connected in series to a path connecting a power source and a load, means for controlled reapplied voltage which is reapplied between the emitter and the collector of the transistor during the transistion period when the transistor is switched to the OFF state to suppress the reapplied voltage at the time the collector current is substantially broken.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings in which:

FIG. 1(a) is a circuit diagram of a conventional transistor switch;

FIGS. 1(b), 1(c) are characteristic curves showing the relation of collector current $I_C$ to collector voltage $V_{CE}$ of the transistor;

FIG. 2(a) is a circuit diagram of one embodiment of the transistor switch in accordance with the invention;

FIG. 2(b) is a characteristic curve showing the relation of collector current $I_C$ to collector voltage $V_{CE}$;

DETAILED DESCRIPTION OF THE PREFERRED EMBODIMENTS

Figure 3A:
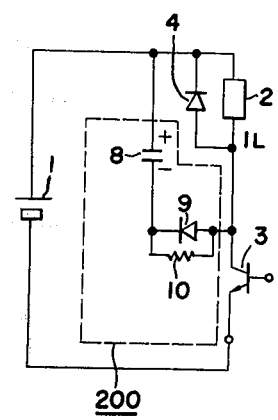
FIGS. 3(a) – 3(c) are circuit diagrams of other embodiments of the invention.

Referring now to the drawings, wherein like reference numerals designate identical or corresponding parts through the several views, and more particularly to FIG. 2 thereof, FIG. 2(a) is a circuit diagram of one embodiment of the power transistor switch in accordance with the invention. The switch comprises reapplied voltage suppress means 200 to suppress the reapplied voltage rising speed at a transistion period for switching a transistor 3 from the ON state to the OFF state. In FIG. 2(a), the reapplied voltage suppress means consists of a capacitor 8, a diode 9 connected in series therewith and a discharge resistor 10.

When the transistor 3 is switched from the ON state to the OFF state, the electrostatic capacity of the capacitor 8 can be selected so as to give a reapplied voltage $V_{CE}(t_2)$ at the time $t_2$ to substantially break the collector current $I_C$ which is lower than the applied voltage $V_{CE}(t_3)$ at the time $t_3$ which reaches to a stationary level depending upon power source 1. Thus, the discharge resistor 10 is selected so as to complete the discharge during the period of the ON state. Accordingly, the discharge resistor can be several to several tens times higher than the conventional surge absorber resistor 5. Accordingly, the discharge current during the switching from the OFF state to the ON state can be neglected.

As shown in FIG. 2(b), the transistor is turned off in the locus of the curve E and is turned on in the locus of the curve B. On the other hand, the secondary breakdown of the transistor is considered from the viewpoint of practical use. The secondary breakdown limit at the time of switching from the OFF state to the ON state is high, but the secondary breakdown limit during the period of switching from the ON state to the OFF state is low. The difference of the secondary breakdown limits is large. For example, the former limit is 3 – 5 times higher than the latter limit as shown by the switching power.

The reason for the difference is that the breakdown phenomenon itself is used to switch from the OFF state to the ON state. When the transistor is switched from the OFF state to the ON state by the base control, even though the primary breakdown phenomenon which is an indication of the secondary breakdown is temporarily given, the transistor is forwardly biased by the carrier injection from the base before the secondary breakdown whereby the transistor is switched to the normal ON state.

On the other hand, when the transistor is switched from the ON state to the OFF state, the transistor is switched from the primary breakdown state to the secondary breakdown state by the thermal run away. That is, the primary breakdown phenomenon itself is in the relation of the opposite direction to the transition to the OFF state which is the desired state. Accordingly, the difference of the breakdown limits for switching directions is as stated above.

During the turn-off period, the voltage should reach breakdown just after contact temperature is raised by the switching power. Accordingly, a severe condition is required. Because of the above-mentioned reason, in the embodiment of FIG. 2(a), the Lissajous' diagram of collector voltage $V_{CE}$-collector current $I_C$ of FIG. 2(b) is given. Accordingly, the difference of the secondary breakdown limits can be balanced.

Accordingly, the switch-off from the ON state to the OFF state is attained under the same voltage-current condition of the switch-on from the OFF state to the ON state to provide the switching of a voltage-current product of 2.5 – 4 times of that of the conventional transistor switch of FIG. 1. That is, the transistor can be used without derating to the maximum rated withstand voltage $V_{CEO} - V_{CBO}$ and current $I_{C\ max}$ and can be used only derating to the surge for a thyristor and a diode.

In conventional switches, the maximum limit of the reapplied voltage $V_{CE}$ (off) which can be turned off (for example DC power source voltage E of FIG. 1) has been limited by the collector-emitter sustaining voltage $V_{CE}$ (sus) (maximum voltage attained in the turn-off step) for the current breakdown condition, and the indispensable condition of turn-off has been $$E < V_{CE} (\text{off}) < V_{CE} (\text{sus}).$$

On the contrary, in accordance with the invention, turn-off is attained when the voltage $V_{CE}(t_2)$ at the current breakoff point is lower than the collector-emitter sustaining voltage $V_{CE}$ (sus).

The reapplied voltage $V_{CE}$ (off) is limited by the electrostatic withstand voltages $V_{CEO} - V_{CES} - V_{CEB}$, wherein $V_{CEO}$ designates collector-emitter blocking voltage in the opened circuit between base and emitter; $V_{CES}$ designates collector-emitter blocking voltage in the shorted circuit between base and emitter, and $V_{CEB}$ designates collector-emitter blocking voltage under base reverse bias, and the electrostatic withstand voltage is substantially the same as $V_{CBO}$. Accordingly, the reapplied voltage $V_{CE}$ (off) which can be turned off (corresponding to $V_{CE}(t_3)$ of FIG. 2) can be significantly increased to give the indispensable turn-off condition of $V_{CE}$ (off) $< V_{CE}$ (sus).

In general, $V_{CBO}$ is 1.3 – 2.5 times of $V_{CE}$ (sus). Accordingly, the turn-off limit can be increased 1.3 – 2.5 times. On the other hand, a transistor having low $V_{CE}$ (sus) can be used so that the preparation of the transistor is facilitated. Moreover, from the above-mentioned viewpoint, it is preferable to use a power switching transistor having a ratio of $V_{CBO}/V_{CE}$ (sus) of 1.5 – 3.

Figure 3B:
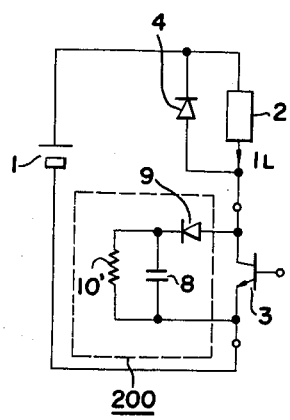
Figure 3C:
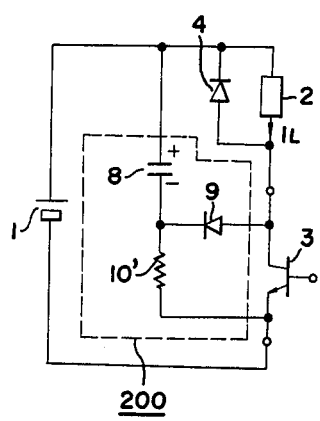

FIGS. 3(a) – 3(c) are respectively circuit diagrams of other embodiments.

FIG. 3(a) is a modification of the embodiment of FIG. 2(a) wherein one end of the capacitor 8 is connected to the terminal of the DC power source at the opposite side of the transistor so as to be parallel to the load. In this embodiment, during the period of the ON state of the transistor, the capacitor 8 is slowly charged in the polarity of FIG. 3(a) through the resistor 10.

At the time the transistor 3 is switched from the ON state to the OFF state, the load current $I_L$ is fed through diode 9 — capacitor 8 — load 2 when the potential of the transistor 3 at the load contact is increased so that the reapplied voltage rising speed for the transistor 3 is controlled. Accordingly, the collector current of the transistor 3 cannot be broken down before reaching the reapplied voltage $V_{CE}$ (off) to raise the voltage of the transistor 3 to a high voltage after providing the OFF state of the transistor 3. Accordingly, as in the embodiment of FIG. 2, it is possible to provide an OFF state to the limit of the withstand voltage.

FIGS. 3(b), 3(c) are respectively other embodiments used for a switch which is turned on and off by a low frequency. In these embodiments, the connection of the diode 9 and the capacitor 8 is the same as that of FIG. 2(a) and FIG. 3(a) but the discharge or charge of the capacitor 8 is conducted by the resistor 10', a connection which is modified. In these embodiments, the resistor 10' is a shunt resistor in the OFF state of the transistor 3 so that the time constant to the capacitor 8 is long. Accordingly, the embodiments can be used as a switch for low frequency.

The embodiments are also useful for passing a predetermined base current in the OFF state of the transistor 3. For example, the embodiments are suitable for when the transistor is connected in parallel to the main resistor to conduct variable resistor control type power at an average effective value.

FIG. 4 is a circuit diagram of an improved embodiment of the invention wherein the effective result of the former embodiment with respect to the rise of the junction temperature is further improved and the capacity required for the reapplied voltage rising speed suppress means (electrostatic capacity of the capacitor 8 and power consumption of the resistor 10) is decreased.

In the embodiment of FIG. 2(a), the capacitor 8 is selected to delay the reapplied voltage rising speed (referred to as a collector voltage rise time $t_{rvce}$) at a high rate to the current falling speed during the turn-off time (referred to as a collector current fall time $t_f$). The electrostatic capacity of the capacitor 8 is selected to give $t_f \leq t_{rvce}$.

Incidentally, the collector current fall time $t_f$ is highly dependent upon the junction temperature and the collector current fall time $t_f$ is rather lengthy at the rated junction temperature with the result that large reapplied voltage rising speed suppress means are disadvantageously required. The switching loss energy is a time integrated value. Accordingly, if the collector current fall time is delayed, the reapplied voltage should be lower for the same loss. That is, the desirable capacity of the reapplied voltage rising speed suppress means is increased depending upon the rise of the junction temperature.

Figure 4A:
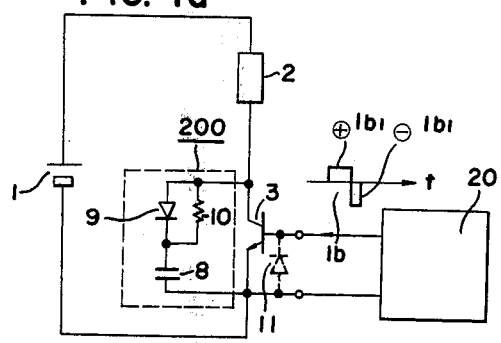
FIG. 4(a), FIG. 5(a), FIG. 6(a) and FIG. 7 are respectively improved embodiments of transistor switches of the invention.
Figure 4B:
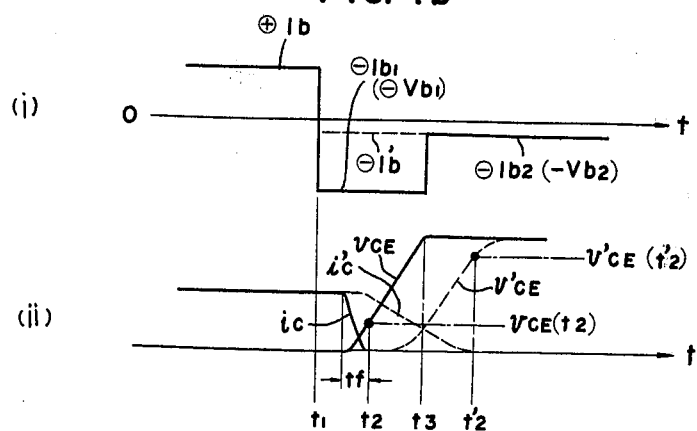
FIG. 4(b), FIG. 5(b) and FIG. 6(b) are respectively waveforms for illustrating the corresponding embodiments.

The time relations of the base current $I'_b$ and the collector current $i'_c$ to the collector voltage $V'_{CE}$ are shown by the dotted line in FIG. 4(b) (i), (ii). When the falling speed of the collector current $i'_c$ is slower, the reapplied voltage $v'_{CE}$ ($t'_2$) at the finish-time of current breakoff $t'_2$ is higher.

The embodiment of FIG. 4(a) is to overcome this disadvantage. In FIG. 4(a), the base driving circuit 20 provides a pulse reverse bias $\ominus I_{b1}$ for more than a predetermined period after the breakdown of the forward base current $\oplus I_b$. After this period, the normal small reverse bias $\ominus I_{b2}$ is applied. This relation is shown by the full line of FIG. 4(b) (i).

Although it is illustrated for the base current, it is possible to provide it by the base voltage. When it is provided by the base current, it is preferable to connect the diode 11 (or Zener diode) in inverse parallel between the base-emitter in the case of high voltage of the reverse bias source of the base circuit.

In this embodiment, the time relation of the collector current $i_c$ to the collector voltage $V_{CE}$ is shown by the full line of FIG. 4(b) (ii). That is, it is possible to prevent the increase of the fall time $t_f$ of the collector current $i_c$ depending upon the rise of junction temperature. That is, the dependency on the junction temperature can be substantially prevented. Thus, the reapplied voltage suppress effect of the invention is improved so as to impart a synergistic effect both safely and accurately.

The reverse bias pulse not only shortens the switching speed but also facilitates matching the reapplied voltage control in practical operation (to reduce the reapplied voltage suppress means) so that switching is accurately obtained under the maximum rated condition. Moreover, as the dependency of the junction temperature is prevented, it is possible to attain the reinversion switching just after the switching (the switching is turned off just after turning on or is turned on just after turning off). Accordingly, the minimum limit of the ON period $t_{on\ min.}$ and the minimum limit of the OFF period $t_{off\ min.}$ are remarkably improved so that the switching operation in a special time rate is attained. Accordingly, when this is applied to a chopper or an inverter, it is possible to attain the time ratio control (pulse width modulation; complicated multiple modulation switching) as desired.

In the conventional switch, it has been difficult to conduct switching under the high frequency maximum rated condition without selecting a time rate of 30 – 70%, because the rise of junction temperature (including local temperature rise) as a result of the switching power generated during the previous switching operation cannot be removed as desired even though the repeat switching period is long in the short period repeating switching operation (less than about several ten $\mu$ sec.). Accordingly, the rise of junction temperature caused by the switching power generated following the previous temperature rise is added to that of the previous temperature rise whereby the secondary breakdown is caused.

On the contrary, in accordance with the invention, the switching power from the ON state to the OFF state is small (as the reapplied voltage rising speed suppress and the pulse reverse bias) even under a relatively high rise of junction temperature (average temperature rise by the current and switching).

Even though the two switching operations (ON state to OFF state and OFF state to ON state) are repeated for short periods, the multiple addition of the rise of local temperature caused by the switching is relatively low as one switching power is suppressed. Acccordingly, the switch imparts a significant effect for the repeat switching operation. Accordingly, a desirable time rate control can be attained.

In the embodiment of FIG. 4(a), when the constant voltage reverse bias (the reverse bias voltage $V_b$ is not converted to $V_{b1}$, $V_{b2}$) is applied and the impedance of the reverse bias source 20 is relatively low as desired, a desirable pulse reverse bias current $\ominus I_{b1}$ is passed as shown in FIG. 4(b) depending upon the carrier discharge of the transistor 3 to reach a small reverse bias current $\ominus I_{b2}$ by completing the carrier discharge. In the case of the constant voltage reverse bias, the diode 11 is not used to give the voltage $-V_b$ within the allowable voltage $V_{CE}$ between the base-emitter.

Figure 5A:
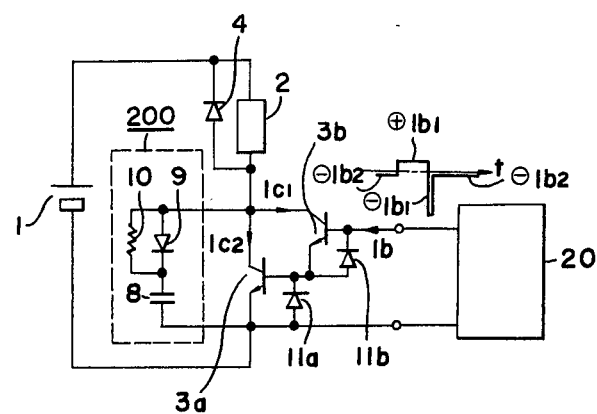

FIG. 5(a) is a circuit diagram of another embodiment of the invention wherein the transistors are disposed in a Darlington connection. The second transistor 3 b has substantially the same rated value or ½-⅓ of the maximum rated collector current of the first transistor 3 a.

The secondary breakdown limit of the second transistor 3 b for switching from the ON state to the OFF state is substantially similar to the secondary breakdown limit of the first transistor 3 a for switching from the OFF state to the ON state (breakdown limit using the reapplied voltage suppress means 200). That is, it is different from the conventional one for decreasing the driving base current for the current amplification coefficient of the second transistor 3 b from the reference current amplification degree. The Darlington connection of the invention is for improving the partial reception of the switching power and the high frequency large power switching limitation.

Figure 5B:
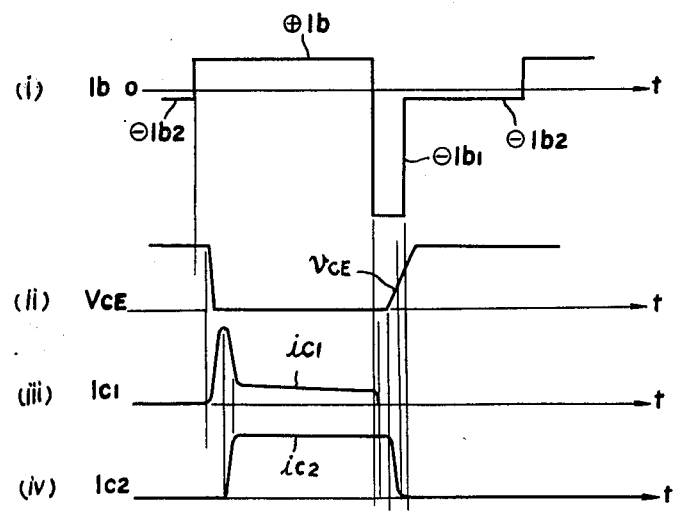

In the embodiment of FIG. 5(a), the wave-form of the base driving current is shown in FIG. 5(b) (i). The pulse reverse bias base current $\ominus I_{b1}$ is commonly fed to both the first and second transistors 3 a, 3 b. Accordingly, the reverse bias pulse current $\ominus I_{b1}$ is several to several ten times higher than that of the forward bias current $\oplus I_b$ in absolute value. In the case of constant voltage reverse bias, the diode 11a is omitted.

Similar to the embodiment of FIG. 4, the pulse reverse bias current $\ominus I_{b1}$, the peak value of which is limited by the impedance of the reverse bias source, is fed depending upon the carrier discharge of the transistor 3 a. The transistor 3 a is inversely biased by the carrier discharge base current $\ominus I_{b1}$ of the transistor 3 a. Thus, when the switch is switched from the OFF state to the ON state, the second transistor 3 b is turned on to partially receive the turn-on initial load path current and then the first transistor 3 a is turned on to receive the substantial load path current.

On the other hand, when the switch is switched from the ON state to the OFF state, the second transistor 3 b is turned off and then the first transistor 3 a is turned off to raise the collector voltage. These time relations are shown in FIGS. 5(b) (i), (ii), (iii), (iv). As should be understood from the above-mentioned illustration, the second transistor 3 b receives all of the load current at first during the turn-on period and the first transistor 3 a receives the normal load current and all of load current during the turn-off period. That is, the second transistor 3 b receives the switching power during the turn-on period and the first transistor receives the collector loss in the normal ON state and the reduced turn-off switching power.

On the other hand, the second transistor 3 b has a small collector loss in the normal ON state. Accordingly, the average temperature rise is lower whereby higher turn-on switching power can be received (compared to a high maximum rated capacity).

On the other hand, the first transistor 3 a has a large collector loss in the normal ON state and, accordingly, the average temperature rise is high. However, the turn-off switching power is controlled in accordance with the invention whereby the large power can be turned on and off. Thus, a suitable balanced power transistor switch is obtained. That is, a synergistic effect is obtained by the reapplied voltage suppress and the switching power division by the Darlington connection.

Figure 6A:
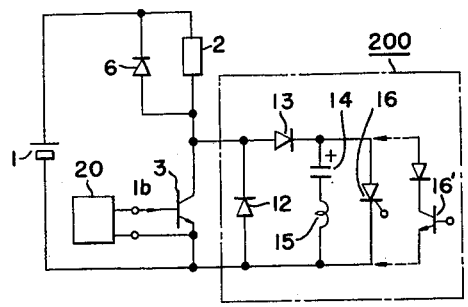

FIG. 6(a) is a circuit diagram of another embodiment of the invention wherein the reapplied voltage is completely suppressed during the turn-off period. In FIG. 6(a), the reference numerals 12, 13 designate diodes; 14 designates a capacitor; 15 designates an inductance and 16 designates an auxiliary switch of a thyristor 16 or a transistor 16'.

In this embodiment, the turn-off ability is improved to about the turn-on ability by utilizing the characteristic of the semiconductor switch which has a relatively high allowable switching power to that of the turn-on. In FIG. 6(a), the capacitor 14 is charged in the polarity shown during the period of the OFF state of the transistor 3.

When the transistor 3 is turned on, the current of the load 2 is transmitted. When the transistor 3 is turned off, the auxiliary switch 16 is turned on at the time $t_2$ which is prior to a predetermined period from the time of breakdown or reverse bias of the base current. The capacitor 14 is oscillated and charged in the opposite polarity by feeding current through the auxiliary switch 16 and the inductance 15 whereby the pulse current is continuously fed through the diodes 12, 13.

Figure 6B:
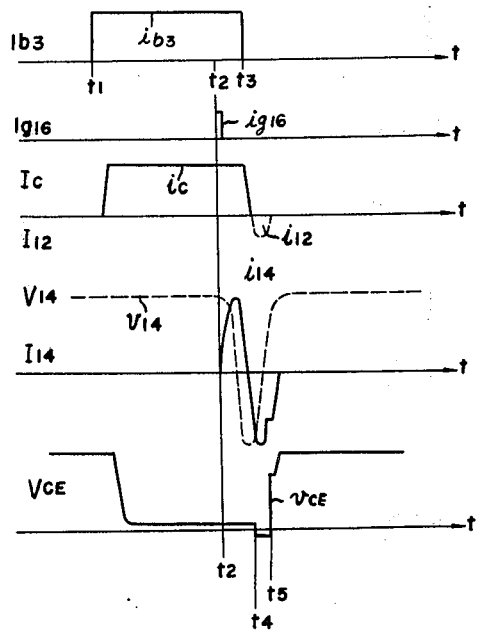

On the other hand, the base current of the transistor 3 is caused to break down or to be reversely biased at the time $t_3$ at about the time the pulse current of the capacitor 14 is inverted. The timing $t_3$ is between the time $t_2$ turning on the auxiliary switch 16 and the time $t_4$ initiating the current to the diode 12. The capacitor 14 is further oscillated and charged to the polarity shown in FIG. 6, the diode 12 assumes the OFF state and the collector voltage is reapplied. The transistor 3 is returned to the OFF state prior to the reapplying time $t_5$. Accordingly, the turn-off switching power can be neglected and the power transistor switch of the invention can continue the switching operation to the allowable breakdown limit at the turn-on of the transistor 3 and the auxiliary switch 16 or 16' without being limited to a lower value for the secondary breakdown limit at the turn-off of the transistor 3.

Figure 7:
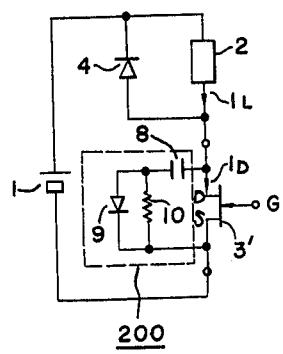

A junction type transistor is used in the embodiments. However, a similar result can be obtained by using a field effect type power transistor 3' as shown in FIG. 7.

As stated above, in accordance with the invention, the breakdown of the transistor at turn-off can be prevented or the turn-off switching power can be significantly reduced by the reapplied voltage suppress. The breakdown limitation for allowable switching can be significantly improved. Especially, it is possible to turn off the switch with the reapplied voltage normal value (such as power voltage) over the collector-emitter sustaining voltage $V_{CE}$ (sus). Accordingly, the practical maximum voltage is not limited to $V_{CE}$ (sus) and the practical reapplied voltage can be increased to about the collector-base electrostatic withstand voltage $V_{CBO}$ at high voltage.

On the other hand, when the same voltage is applied, $V_{CE}$ (sus) is lower. Accordingly, the transistor is easily prepared.

When the pulse inverse bias is combined, the applied voltage control means can be reduced and the dependency of the reapplied voltage suppress effect on the rise of junction temperature can be prevented. When the Darlington connection is combined, the normal ON loss and the switching power are divided to provide a suitable balanced transistor switch.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. A power transistor switch comprising:
a transistor having an emitter, a collector and a base for ON-OFF switching, the transistor being connected in series to a path connecting a power source and a load,
means for controlling reapplied voltage which is reapplied between the emitter and the collector of the transistor during the transition period when the transistor is switched to the OFF state to suppress the reapplied voltage at the time the collector current is substantially broken,
said means comprising a resistor, a capacitor and a diode,
means connecting the diode and the resistor in series between the emitter and the collector of the transistor,
means connecting the capacitor between the power source and the junction of the resistor and the diode.

2. A power transistor switch comprising:
a transistor having an emitter, a collector and a base for ON-OFF switching, the transistor being connected in series to a path connecting a power source and a load,
means for controlling reapplied voltage which is reapplied between the emitter and the collector of the transistor during the transition period when the transistor is switched to the OFF state to suppress the reapplied voltage at the time the collector current is substantially broken,
said means comprising a resistor, a capacitor and a diode,
means connecting the diode and the resistor in series between the emitter and the collector of each transistor,
means connecting the capacitor in parallel with the resistor.

3. A power transistor switch comprising:
a transistor having an emitter, a collector and a base for ON-OFF switching, the transistor being connected in series to a path connecting a power source and a load,
means for controlling reapplied voltage which is reapplied between the emitter and the collector of the transistor during the transition period when the transistor is switched to the OFF state to suppress the reapplied voltage at the time the collector current is substantially broken,
said means comprising first and second diodes, a capacitor, an inductor and a thyristor,
means connecting the first diode between the emitter and the collector of the transistor,
means connecting the second diode, the capacitor and the inductor in series between the emitter and the collector of the transistor,
means connecting the thyristor in parallel with the series connection of the capacitor and the inductor.

* * * * *